United States Patent
Granneman et al.

(10) Patent No.: US 7,691,750 B2
(45) Date of Patent: *Apr. 6, 2010

(54) METHODS OF FORMING FILMS IN SEMICONDUCTOR DEVICES WITH SOLID STATE REACTANTS

(75) Inventors: Ernest H. A. Granneman, Hilversum (NL); Vladimir Kuznetsov, Ultrecht (NL); Xavier Pages, Lovenjoel (BE); Cornelius A. van der Jeugd, Heverlee (BE)

(73) Assignee: ASM International N.V. (NL)

( * ) Notice: Subject to any disclaimer, the term of this patent is extended or adjusted under 35 U.S.C. 154(b) by 388 days.

This patent is subject to a terminal disclaimer.

(21) Appl. No.: 11/595,441

(22) Filed: Nov. 9, 2006

(65) Prior Publication Data

US 2007/0059932 A1 Mar. 15, 2007

Related U.S. Application Data

(63) Continuation of application No. 10/866,643, filed on Jun. 10, 2004, now Pat. No. 7,153,772.

(60) Provisional application No. 60/478,324, filed on Jun. 12, 2003.

(51) Int. Cl.
*H01L 21/44* (2006.01)
(52) U.S. Cl. .............. 438/682; 257/E21.165; 257/E21.438
(58) Field of Classification Search .............. 438/682; 257/E21.165, E21.438
See application file for complete search history.

(56) References Cited

U.S. PATENT DOCUMENTS

| | | | |
|---|---|---|---|
| 4,521,952 A | 6/1985 | Riseman | |
| 4,605,947 A | 8/1986 | Price et al. | |
| 4,870,030 A | 9/1989 | Markunas et al. | |
| 4,994,402 A | 2/1991 | Chiu | |
| 5,032,233 A | 7/1991 | Yu et al. | |
| 5,043,300 A | 8/1991 | Nulman | |

(Continued)

FOREIGN PATENT DOCUMENTS

DE 19820147 A1 7/1999

(Continued)

OTHER PUBLICATIONS

Lou, et al., "*The Process Window of a-Si/Ti Bilayer Metallization for an Oxidation-Resistant and Self-Aligned TiSi2 Process*," IEEE Transactions on Electron Devices, vol. 39, No. 8, Aug. 1992, pp. 1835-1843.

(Continued)

*Primary Examiner*—Fernando L Toledo
(74) *Attorney, Agent, or Firm*—Knobbe, Martens, Olson & Bear LLP (57) ABSTRACT

A method of self-aligned silicidation involves interruption of the silicidation process prior to complete reaction of the blanket material (e.g., metal) in regions directly overlying patterned and exposed other material (e.g., silicon). Diffusion of excess blanket material from over other regions (e.g., overlying insulators) is thus prevented. Control and uniformity are insured by use of conductive rapid thermal annealing in hot wall reactors, with massive heated plates closely spaced from the substrate surfaces. Interruption is particularly facilitated by forced cooling, preferably also by conductive thermal exchange with closely spaced, massive plates.

22 Claims, 7 Drawing Sheets

U.S. PATENT DOCUMENTS

| | | | |
|---|---|---|---|
| 5,084,406 A | 1/1992 | Rhodes et al. | |
| 5,094,977 A | 3/1992 | Yu et al. | |
| 5,147,819 A | 9/1992 | Yu et al. | |
| 5,187,122 A | 2/1993 | Bonis | |
| 5,196,360 A | 3/1993 | Doan et al. | |
| 5,231,056 A | 7/1993 | Sandhu | |
| 5,236,865 A | 8/1993 | Sandhu et al. | |
| 5,278,098 A | 1/1994 | Wei et al. | |
| 5,319,220 A | 6/1994 | Suzuki et al. | |
| 5,326,992 A | 7/1994 | Yoder | |
| 5,341,016 A | 8/1994 | Prall et al. | |
| 5,378,641 A | 1/1995 | Cheffings | |
| 5,378,901 A | 1/1995 | Nii | |
| 5,389,575 A | 2/1995 | Chin et al. | |
| 5,480,814 A | 1/1996 | Wuu et al. | |
| 5,508,212 A | 4/1996 | Wang et al. | |
| 5,656,519 A | 8/1997 | Mogami | |
| 5,656,546 A | 8/1997 | Chen et al. | |
| 5,670,404 A | 9/1997 | Dai | |
| 5,683,922 A | 11/1997 | Jeng et al. | |
| 5,756,394 A | 5/1998 | Manning | |
| 5,831,335 A | 11/1998 | Miyamoto | |
| 5,856,237 A | 1/1999 | Ku | |
| 5,888,903 A | 3/1999 | O'Brien et al. | |
| 5,945,350 A | 8/1999 | Violette et al. | |
| 6,008,111 A | 12/1999 | Fushida et al. | |
| 6,049,098 A | 4/2000 | Sato | |
| 6,074,478 A | 6/2000 | Oguro | |
| 6,147,405 A | 11/2000 | Hu | |
| 6,153,010 A | 11/2000 | Kiyoku et al. | |
| 6,153,520 A | 11/2000 | Chen | |
| 6,177,761 B1 | 1/2001 | Pelka et al. | |
| 6,183,565 B1 | 2/2001 | Granneman et al. | |
| 6,190,453 B1 | 2/2001 | Boydston et al. | |
| 6,190,976 B1 | 2/2001 | Shishiguchi et al. | |
| 6,277,735 B1 | 8/2001 | Matsubara | |
| 6,316,795 B1 | 11/2001 | Croke, III | |
| 6,345,150 B1* | 2/2002 | Yoo | 392/418 |
| 6,365,453 B1 | 4/2002 | Deboer et al. | |
| 6,372,584 B1 | 4/2002 | Yu | |
| 6,455,935 B1 | 9/2002 | Hu | |
| 6,462,411 B1* | 10/2002 | Watanabe et al. | 257/723 |
| 6,486,018 B2 | 11/2002 | Roberts et al. | |
| 6,524,953 B1 | 2/2003 | Hu | |
| 6,566,279 B2 | 5/2003 | Suemitsu et al. | |
| 6,716,713 B2 | 4/2004 | Todd | |
| 6,743,721 B2 | 6/2004 | Lur et al. | |
| 6,821,825 B2 | 11/2004 | Todd et al. | |
| 6,958,253 B2 | 10/2005 | Todd | |
| 6,998,305 B2 | 2/2006 | Arena et al. | |
| 7,153,772 B2* | 12/2006 | Granneman et al. | 438/682 |
| 2004/0262694 A1 | 12/2004 | Chidambaram | |
| 2005/0117310 A1 | 6/2005 | Miyamoto et al. | |
| 2006/0205194 A1 | 9/2006 | Bauer | |
| 2006/0234504 A1 | 10/2006 | Bauer et al. | |
| 2006/0240630 A1 | 10/2006 | Bauer et al. | |
| 2007/0287272 A1 | 12/2007 | Bauer et al. | |

FOREIGN PATENT DOCUMENTS

| | | |
|---|---|---|
| JP | 59004040 | 1/1984 |
| JP | 60-10673 A | 1/1994 |
| JP | 1997-251967 | 9/1997 |
| JP | 1999-514154 | 1/1998 |
| JP | 10256354 | 9/1998 |
| JP | 1997-251967 | 12/1999 |
| JP | 2000-208437 | 7/2000 |
| JP | 2000-208437 | 11/2000 |
| WO | WO 01/50502 | 7/2001 |

OTHER PUBLICATIONS

Jeong Soo Byun, Hak Nam Kim et al., "Formation of a large grain sized TiN layer using $TiN_x$, the epitaxial continuity at the Al/TiN interface . . . ", J. Appl. Phys. 78(3), Aug. 1, 1995, pp. 1719-1724.

Jeong Soo Byun, Chang Reol Kim et al., "$TiN/TiSi_2$ Formation Using $TiN_x$ Layer and Its Feasibilities in ULSI", Jpn. J. Appl. Phys. vol. 35 (1995), pp. 982-986.

Jeong Soo Byun, "Epitaxial $C49$-$TiSi_2$ Formation on (100)Si Substrate Using $TiN_x$ and Its Electrical Characteristics as a Shallow Contact Metallization", J. Electrochem. Soc., vol. 143, No. 6, Jun. 1996, pp. 1984-1991.

Jeong S. Byun, Kwan G. Rha et al., "Epitaxial $TiSi_2$ Growth on Si(100) From Reactive Sputtered $TiN_x$ and Subsequent Annealing", Materials Research Soc. Proceedings, vol. 355, Pittsburgh, 1995, pp. 465-470.

Jeong Soo Byun, Jun Ki Kim et al., "W as a Bit Line Interconnection in Capacitor-Over-Bit-Line (COB) Structured Dynamic Random Access Memory (DRAM) and Feasible Diffusion Barrier Layer", Jpn. J. Appl. Phys. vol. 35 (1996), pp. 1086-1089.

Kuznetsov et al., "Continuity in development of ultra shallow junctions for 130-45 nm CMOS: the tool and annealing methods," Abstract 11th IEEE, RTP 2003 Conference, Sep. 23-26, 2003, Charleston, USA.

Lauwers, et al., "Low temperature spike anneal for Ni-silicide formation," Microelectronic Engineering 76, 303-310 (MAM2004, Brussels, Belgium, Mar. 7-10, 2004).

Pages, et al., "The effect of ramp rate—short process time and partial reactions on cobalt and nickel silicide formation," Proceedings 205th ECS Meeting, May 9-13, 2004, San Antonio TX, USA, p. 174-182.

Van Houtum, H. et al., "TiSi2 strap formation by Ti-amorphous-Si reaction," J. Vac. Sci. Technol. B 6(6), Nov./Dec. 1988, pp. 1734-1739.

Antonell et al., "Carbon incorporation for strain compensation during solid phase epitaxial recrystallization of SiGe on Si at 500-600° C," J. Appl. Phys. 79 (10), pp. 7646-7651, (May 15, 1996).

Aoyama et al., "Si selective epitaxial growth using $Cl_2$ pulsed molecular flow method," Thin Solid Films 321, pp. 256-260 (1998).

Bauer et al., "$Si_3H_8$ Based Epitaxy of Biaxially Stressed Silicon Films Doped with Carbon and Arsenic for CMOS Applications," Mater. Res. Soc. Symp. Proc., vol. 864, Materials Research Society (2005).

Bauer et al., "Time resolved reflectivity measurements of silicon solid phase epitaxial growth," Thin Solid Films, 000, pp. 228-232 (2000).

Berti et al. "Lattice parameter in $Si_{1-y}C_y$ epilayers: Deviation from Vegard's rule," Appl. Phys. Lett., vol. 72, No. 13, 1602-1604 (Mar. 30, 1998).

Celotti et al. "Lattice parameter study of silicon uniformly doped with boron and phosphorous," Journal of Materials Science 9, 821-828 (1974).

Eberl et al., "Structural properties of SiC and SiGeC alloy layers on Si," 75-77 (Mar. 1999).

Feng et al., "Raman determination of layer stresses and strains for heterostructures and its application to the cubic SiC/Si system," J. Appl. Phys. 64 (12), 6827-6835 (Dec. 15, 1988).

Goesele et al., "Diffusion Engineering by Carbon in Silicon," Mat. Res. Soc. Symp. vol. 610, B71.1-B712.1 (2000).

Hartmann et al., "High C content $Si/Si_{1-y}C_y$ heterostructures for n-type metal oxide semiconductor transistors," Semicond. Sci. Technol. 19, 593-601 (2004).

Hoyt, Judy L., "Substitutional Carbon Incorporation and Electronic Characterization of $Si_{1-y}C_y$/Si and $Si_{1-x-y}Ge_xC_y$/Si Heterojunctions," Solid State Electronics and Photonics Laboratory, Center for Integrated Systems, Rm. 325X, Stanford, CA, Chapter 3, 59-89; (Mar. 23, 2002).

Kim et al., "Low temperature selective Si epitaxy by reduced pressure chemical vapor deposition introducing periodic deposition and etching cycles with $SiH_4$, $H_2$ and HCl," Mat. Res. Soc. Symp. Proc., vol. 609 (2000).

Kouvetakis, John and Mayer, James W., "Synthesis and Analysis of Compounds and Alloys in the GeC, SiC, and SiGeC Systems," Department of Chemistry and Biochemistry and Center for Solid State Science, Arizona State University, Tempe, AZ; (Mar. 21, 2002).

Meléndez-Lira et al., "Substitutional carbon in $Si_{1-y}C_y$ alloys as measured with infrared absorption and Raman spectroscopy," *J. Appl. Phys.* 82 (9), 4246-4252 (Nov. 1, 1997).

Mertens et al. "Study of Ni-silicide contacts to Si:C source/drain", The Electrochemical Society Meeting, (Oct. 30, 2006), Cancun, Mexico.

Oehme et al., "Carbon Segregation in Silicon," *Thin Solid Films* 380, 75-77 (2000).

O'Neil et al., "Optimization of Process Conditions for Selective Silicon Epitaxy Using Disilane, Hydrogen, and Chlorine," *J. Electrochem. Soc.*, vol. 144, No. 9, 3309-3315 (Sep. 1997).

Osten et al., "Substitutional carbon incorporation in epitaxial $Si_{1-y}C_y$ alloys on Si(001) growth by molecular beam epitaxy," *Applied Physics Letters*, vol. 74, No. 6, 836-838 (Feb. 8, 1999).

Osten et al., "Substitutional versus interstitial carbon incorporation during pseudomorphic growth of $Si_{1-y}C_y$ on Si(001)," *J. Appl. Phys.* 80 (12), 6711-6715 (Dec. 15, 1996).

Strane et al., "Carbon incorporation into Si at high concentrations by ion implantation and solid phase epitaxy," *J. Appl. Phys.* 79 (2), 637-646; (Jan. 15, 1996).

Strane et al., "Precipitation and relaxation in strained $Si_{1-y}C_y$/Si heterostructures," *J. Appl. Phys.* 76 (6) 3656-3668 (Sep. 15, 1994).

Windl et al., "Theory of strain and electronic structure of $Si_{1-y}C_y$ and $Si_{1-x-y}Ge_xC_y$ alloys," *Physical Review B*, vol. 57, No. 4, 2431-2442 (Jan. 15, 1998).

Wolf et al., "Silicon Processing for the VLSI era," vol. 1, $2^{nd}$ edition; Lattice Pr (Sep. 2000).

Japanese Office Action of Jan. 14, 2009; Application No. JP 2004-175689, filed Jun. 14, 2004.

* cited by examiner

METHODS OF FORMING FILMS IN SEMICONDUCTOR DEVICES WITH SOLID STATE REACTANTS

REFERENCE TO RELATED APPLICATION

This application is a continuation of U.S. patent application Ser. No. 10/866,643, filed Jun. 10, 2004, now U.S. Pat. No. 7,153,772, which claims the priority benefit under 35 U.S.C. §119(e) of provisional Application No. 60/478,324, filed Jun. 12, 2003.

BACKGROUND OF THE INVENTION

1. Field of the Invention

The invention relates generally to the field of semiconductor device manufacturing and, more particularly, to processes for forming films using solid state reactants.

2. Description of the Related Art

In advanced semiconductor devices, part of the silicon that is present in gate, source and drain structures, is converted into low-resistivity metal silicides. This is done to realize a conductive path with a low bulk resistivity on the one hand, and to ensure a good contact resistance on the other hand. In the past, $TiSi_2$ was used for this process; currently $CoSi_2$ is the silicide of choice for the most advanced devices. As both $TiSi_2$ and $CoSi_2$ consume a relatively large amount of silicon, it is expected that for devices to be used for the 65 nm technology node and beyond, there will be a switch to using $NiSi_x$ to form these conductive paths. This silicide combines a low bulk resistivity with a relatively low amount of silicon consumption.

Figure 1A:
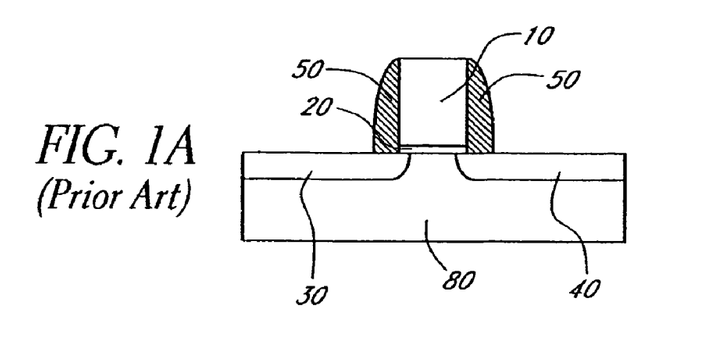
FIGS. 1a-1d are schematic cross-sections of a partially fabricated integrated circuit, illustrating the idealized formation of uniform $NiSi_x$ films on top of gate, source and drain regions of transistors, in accordance with an idealized prior art process flow.
Figure 1B:
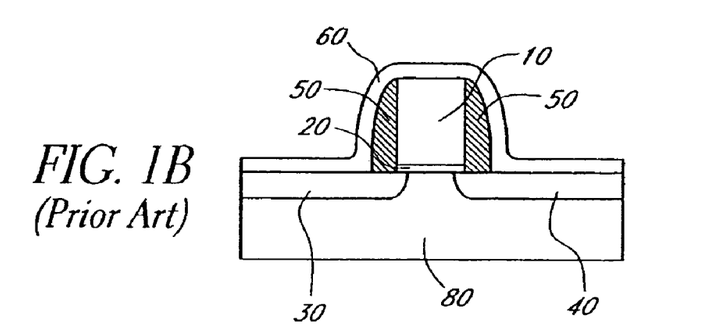

An idealized process of formation of $NiSi_x$ on a substrate 80 is depicted in FIGS. 1a-1d. First, the basic structure of the transistor is formed, including a gate electrode 10, a gate dielectric 20, a source 30 and a drain 40 (FIG. 1a). On the sides of the polycrystalline silicon (poly-Si) gate, so-called spacers 50 are deposited to insulate the sidewalls of the poly-Si/gate oxide stack from films that are subsequently formed. A nickel film 60 (Ni) is then deposited, usually through a physical vapor deposition (PVD, e.g., sputtering) process (FIG. 1b). The wafer is heated to a temperature at which the Ni reacts with the underlying Si to form nickel silicide ($NiSi_x$) 70. Depending on the anneal temperature, $NiSi_x$ as used herein can represent $Ni_2Si$, $NiSi$, $NiSi_2$ and/or a mixture thereof. The temperature is typically kept low enough (e.g., <about 600° C.) to avoid formation of $NiSi_2$, which has a relatively high-resistivity.

Figure 1C:
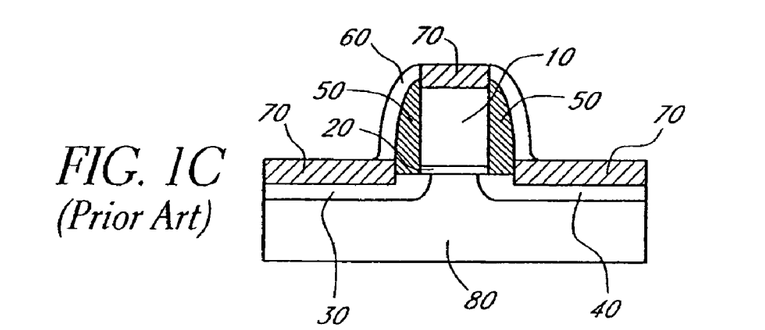
Figure 1D:
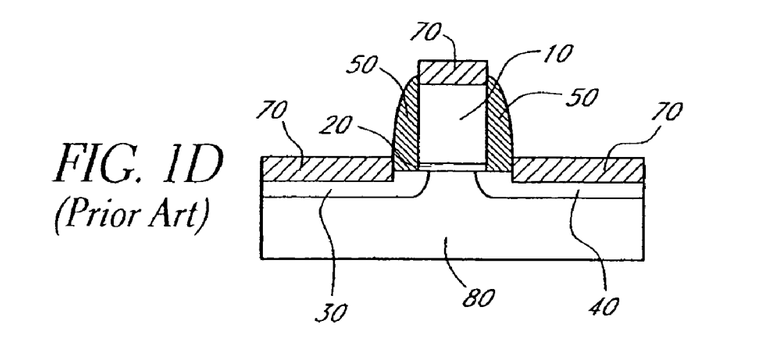
Figure 2A:
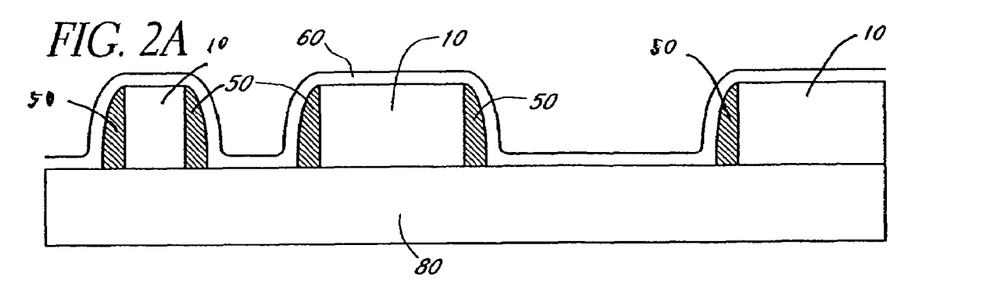
FIGS. 2a-2d illustrate the formation of uneven $NiSi_x$ films due to a "reverse line width effect" associated with the prior art process flow of FIGS. 1a-1d.
Figure 2B:
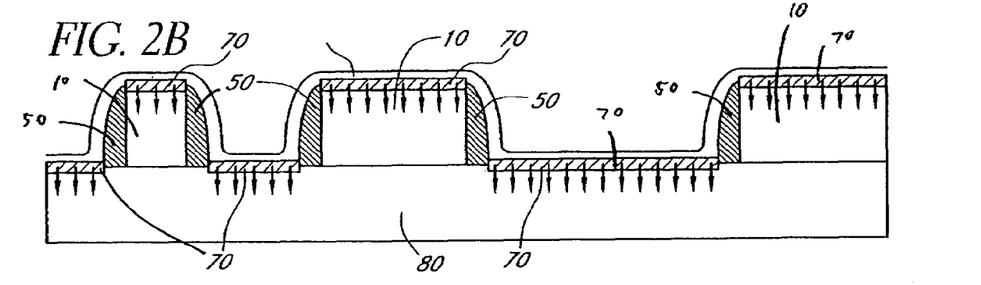
Figure 2C:
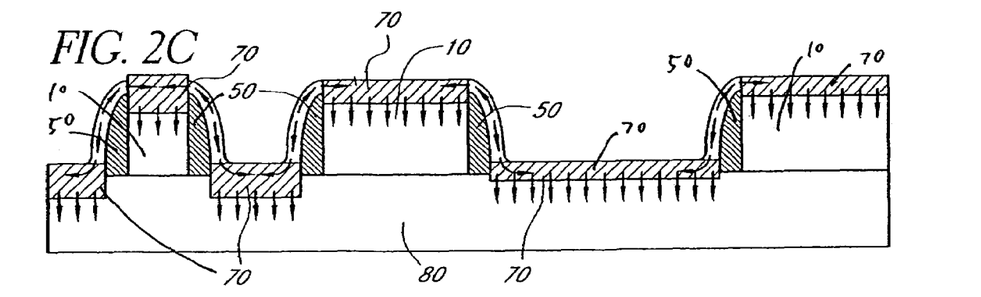
Figure 2D:
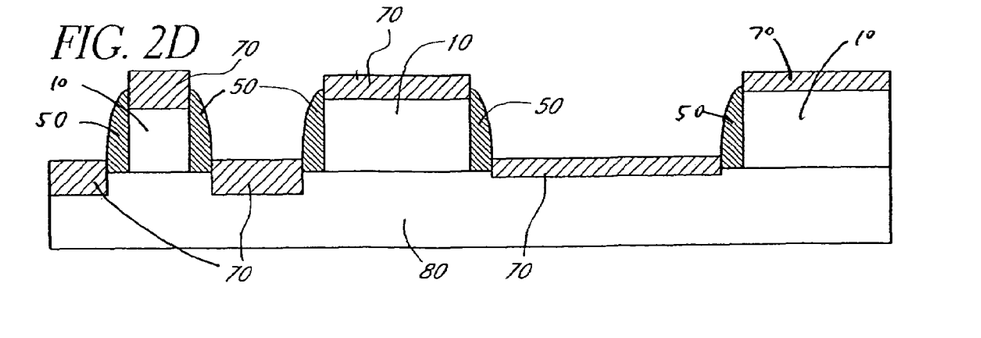

In principle, $NiSi_x$ forms in a self-aligned fashion, i.e., only at locations where Ni and Si are both present. In the illustrated arrangement, such locations have silicon exposed below the metal Ni layer. Thus, ideally, no silicide growth takes place at the position of the spacers 50 (FIG. 1c). In FIG. 1c it is schematically shown that the formation of the silicide film continues until the Ni film has been completely consumed in the regions above exposed silicon. Above the silicon there is no Ni left to react. This process, generally referred to as RTP1 for the first rapid thermal processing step, is generally conducted at temperatures in the range of about 300-400° C.

After this process is finished, the substrate is exposed to a so-called selective metal etch. In this wet etch process, the unreacted Ni is etched while the $NiSi_x$ film remains intact (see FIG. 1d). This results in a low-resistivity silicide on top of the gate, source, drain and any other exposed silicon surfaces. By removing the unreacted Ni, these structures are electrically isolated from each other. Usually, a subsequent anneal (RTP2) at, e.g., 450° C. is applied to ensure that the silicide film is made up of NiSi exclusively, for example, that the preceding $Ni_2Si$ phase formed during silicidation has completely reacted away. Typically, 100 nm Ni is converted into NiSi with a sheet resistance of ~8 μΩcm.

Thus, in theory, the $NiSi_x$ allows the formation of a conductive path with a low bulk resistivity and a good contact resistance. In practice, however, the inventors have found that the resistivity of these $NiSi_x$ films is less than ideal because different films across the surface of a substrate can have different resistivities. Such variances are undesirable because they can introduce non-uniformities in the electrical performance of electrical devices formed using the $NiSi_x$ films.

Accordingly, there is a need for methods of forming $NiSi_x$ films having more uniform resistivities.

SUMMARY OF THE INVENTION

According to one aspect of the invention, a method is provided for processing a semiconductor substrate. The method comprises loading the semiconductor substrate into a process chamber. The substrate comprises a metal film which is in contact with a solid state reactant, such as solid state silicon, over at least some areas of the substrate. The substrate is uniformly heated to a reaction temperature and maintained at the reaction temperature for a duration sufficient for part of the metal to react with the solid state reactant to form a metallic compound. The substrate is removed from the annealing station before all the metal overlying the at least some areas of the substrate has reacted with the solid state reactant.

According to another aspect of the invention, a method is provided for a self-aligned reaction of solid state reactants over a substrate. The method comprises providing a blanket layer of a first solid state reactant, such as a metal film, and providing a patterned structure of a second solid state reactant, such as solid state silicon, in contact with the blanket layer. The blanket layer and the patterned structure are subjected to rapid thermal annealing by disposing the substrate parallel to and facing a uniformly heated and substantially flat heated body to form a reaction product of the first and second solid state reactant in a pattern. The heated body extends over the entirety of the planar substrate surface.

According to yet another aspect of the invention, an integrated circuit is provided. The integrated circuit comprises a plurality of electrical devices having a plurality of electrical contacts. The electrical contacts comprise metal silicide films that have substantially uniform sheet resistances and varying widths.

In a preferred embodiment of the invention, the silicidation is carried out in a Levitor® reactor as disclosed in U.S. Pat. No. 6,183,565 to E. Granneman et al., the entire disclosure of which is incorporated herein by reference.

In yet another embodiment of the invention, after annealing, the substrate is uniformly cooled down in a forced way by bringing the substrate in close proximity with a cooling body that extends over the entire substrate surface.

BRIEF DESCRIPTION OF THE DRAWINGS

The invention will be better understood from the detailed description of the preferred embodiments and from the appended drawings, which are meant to illustrate and not to limit the invention, and wherein.

DETAILED DESCRIPTION OF THE PREFERRED EMBODIMENT

With reference to FIG. 2, the inventors have discovered that the variations in the resistance of $NiSi_x$ films is due to variations in film thickness caused by the movement of nickel in the nickel layer. In particular, the films have different thicknesses because the nickel consumed to form $NiSi_x$ comes not only from the regions immediately overlying silicon, but also from regions of the Ni film that overlie the non-silicon surfaces of various structures (e.g., on top of the spacers 50 and on other insulators). As a result, as shown in FIG. 2a, in an actual electrical device, the dimensions of the various silicon surfaces vary across the die or substrate. When a uniform metal film 60 is deposited (e.g., PVD Ni), the silicidation process starts with the reaction of Si in the substrate 80 with the Ni of the preferred metal layer 60 that is in its immediate vicinity, i.e., directly on top of the Si surfaces, as shown in FIG. 2b. However, the process does not necessarily stop when all the Ni on top of the Si has been consumed. Rather, as shown in FIG. 2c, the process continues with the reaction of Si with Ni that has diffused from areas where no reaction has taken place (e.g., from directly on top of insulators) to areas where Ni has already been consumed to form $NiSi_x$ layer 70. This leads to a situation in which narrow Si lines, such as the structures on the left side of FIG. 2d, have a thicker $NiSi_x$ layer 70 than wider Si lines, such as those shown in the structures on the right of FIG. 2d. This is the so-called "reverse line width effect" and is caused by diffused Ni being more concentrated in the smaller area of narrower width Si lines than the larger area of wider Si lines. The higher concentration of Ni in the narrower Si lines results in increased formation of $NiSi_x$ and increased consumption of silicon in transistor active areas, in those narrower lines.

Figure 3:
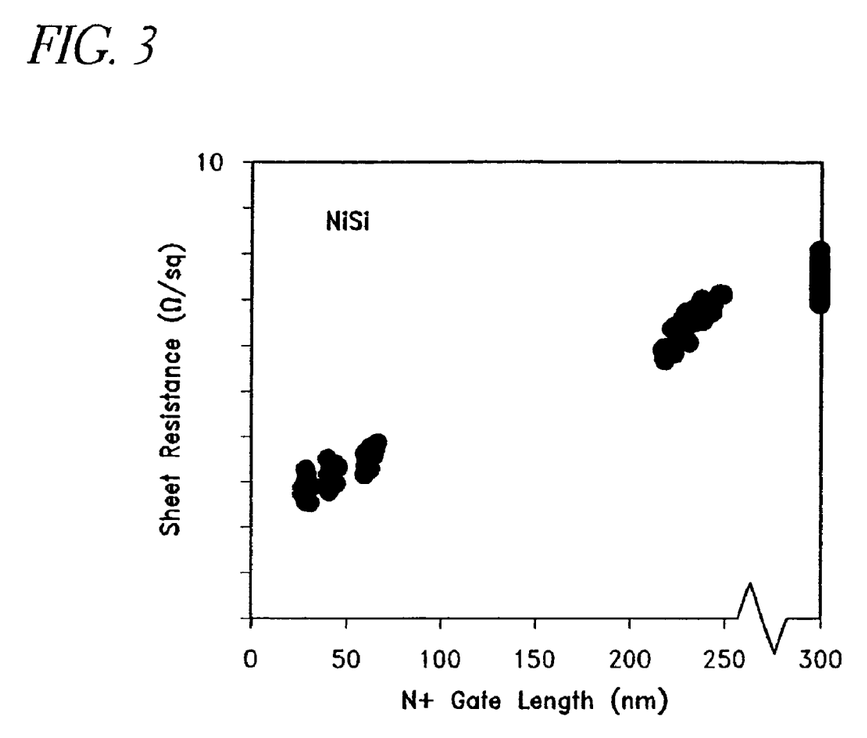
FIG. 3 is a graph of sheet resistivity versus gate length, illustrating an experimental verification of the reverse line width effect, where N+ gate structures with a greater gate length have thinner $NiSi_x$ films, which results in a higher sheet resistance for those films.

An experimental verification of the reverse line width effect is shown in FIG. 3. Note that the gate length of FIG. 3 is a dimension that corresponds to the line width shown in FIG. 2. It demonstrates that 50 nm lines have a silicide film that has a sheet resistivity of about 3 Ω/sq, which is about 2-3 times lower than the sheet resistivity of 1000 nm lines, which have a sheet resistivity of about 8 Ω/sq. As noted above, such a disparity in resistivity is undesirable.

One possible solution for preventing the reverse line width effect is to reduce the annealing time or the anneal temperature so that the end of the anneal coincides with the completion of the silicidation reaction, i.e., the depletion of all the Ni overlying a Si surface. Silicidation processes in lamp heating systems are inflicted with small but significant non-uniformities in temperature. Therefore, when, in such a lamp heating system the silicidation reaction is not complete, the non-uniformities in sheet resistivity increase significantly, and can be larger than the non-uniformities caused by the reverse line width effect. Thus, silicidation processes are typically "overdone," e.g., the anneal is performed for a longer time than theoretically necessary, to ensure that the silicidation is complete everywhere.

Annealing systems that are commonly used today are lamp-based systems based upon radiative heating of substrates, such as wafers, in a cold-wall chamber. While generally considered to be the best way of rapidly increasing a wafer's temperature for rapid thermal annealing, it has been found that radiant heating in a cold-wall chamber is not able to heat the wafer uniformly. Because the rate of reaction of Ni with Si is related to the anneal temperature, this non-uniform heating results in a situation where Ni films can be consumed completely in specific areas on the wafer, whereas in other areas not all the Ni has been consumed. Thus, a large variation of the $NiSi_x$ layer thickness results. Furthermore, the $NiSi_x$ layer can include a mixture of various nickel silicides, including $Ni_2Si$ and NiSi. Variations in the relative concentrations of the $Ni_2Si$ and NiSi that are formed can result in different rates of radiation absorption, potentially further contributing to non-uniform heating rates across the wafer. Thus, the lamp-based systems commonly used for silicidation processes can also contribute to non-uniform $NiSi_x$ layer thickness results.

In sum, one way to avoid the reverse line width effect is to stop. the reaction of Ni with Si at the point when full conversion of the Ni layer immediately overlying an Si surface has just finished. While a good strategy in principle, it is difficult to achieve due to factors such as non-uniform heating. Therefore, because incomplete consumption of Ni with Si can cause significant resistivity increases, silicidation processes are typically "overdone" to some extent to ensure that the silicidation is complete everywhere and that structures having a generally low resistivity are obtained. Consequently, silicidation processes typically exhibit the reverse line width effect, which causes variations in the resistivities of the $NiSi_x$ layers.

While incomplete silicidations would generally be expected to have unacceptably large variations in silicide film sheet resistivities, it has been found that incomplete silicidations can be beneficial for preventing the "reverse line width effect." Moreover, unacceptably large sheet resistivity variations do not necessary follow from incomplete silicidations; rather, as described below, these variations can be significantly reduced.

Advantageously, in accordance with preferred embodiments of the invention, silicide films having relatively low sheet resistivity variations can be formed using reactor systems employing hot wall principles. Preferably, in these systems, a heated body or plate is closely spaced from a substrate and the substrate is heated conductively rather than radiatively. The consequence of this is that wafers can be heated to low temperatures in a very uniform way, while the absorption of energy is also independent of the phase, e.g., $Ni_2Si$ and NiSi for nickel silicides, of a material that is being formed. Consequently, non-uniformities due to non-uniform heating are reduced. As a result, stopping the silicidation. process when the Ni layer is not yet fully converted is particularly advantageous when performed in a hot wall rapid thermal annealing (RTA) apparatus, as described below.

The $NiSi_x$ conversion processes are preferably carried out in a system that comprises at least one uniformly heated and substantially flat body. During processing, a substrate such as a wafer is disposed parallel to and facing the heated body and the heated body extends over the entire flat wafer surface. Preferably the wafer is disposed in close proximity of the heated body, at less than about 2 mm from the heated body, more preferably at less than about 1 mm.

In one preferred embodiment, the $NiSi_x$ formation processes are carried out in a system that comprises two substantially flat heated bodies, where each of the bodies is preferably uniformly heated. The bodies are disposed parallel to and facing each other so that, in a processing condition, a wafer can be accommodated between the bodies and the wafer is disposed parallel to and facing the heated bodies. Each of the heated bodies preferably completely extends over and across one of the opposite flat surfaces of the wafer.

In another preferred embodiment, the heated bodies are massive. By massive, it is meant that the wall, which faces and extends over an entire substrate surface, has a thermal mass greater than about five times (5×) the thermal mass of the substrate, and more preferably greater than about ten times (10×) the thermal mass of the substrate. In practice, this typically entails a metal block of greater than about 10 mm in thickness, measured normal to the substrate surface, more preferably greater than about 40 mm in thickness.

Figure 4:
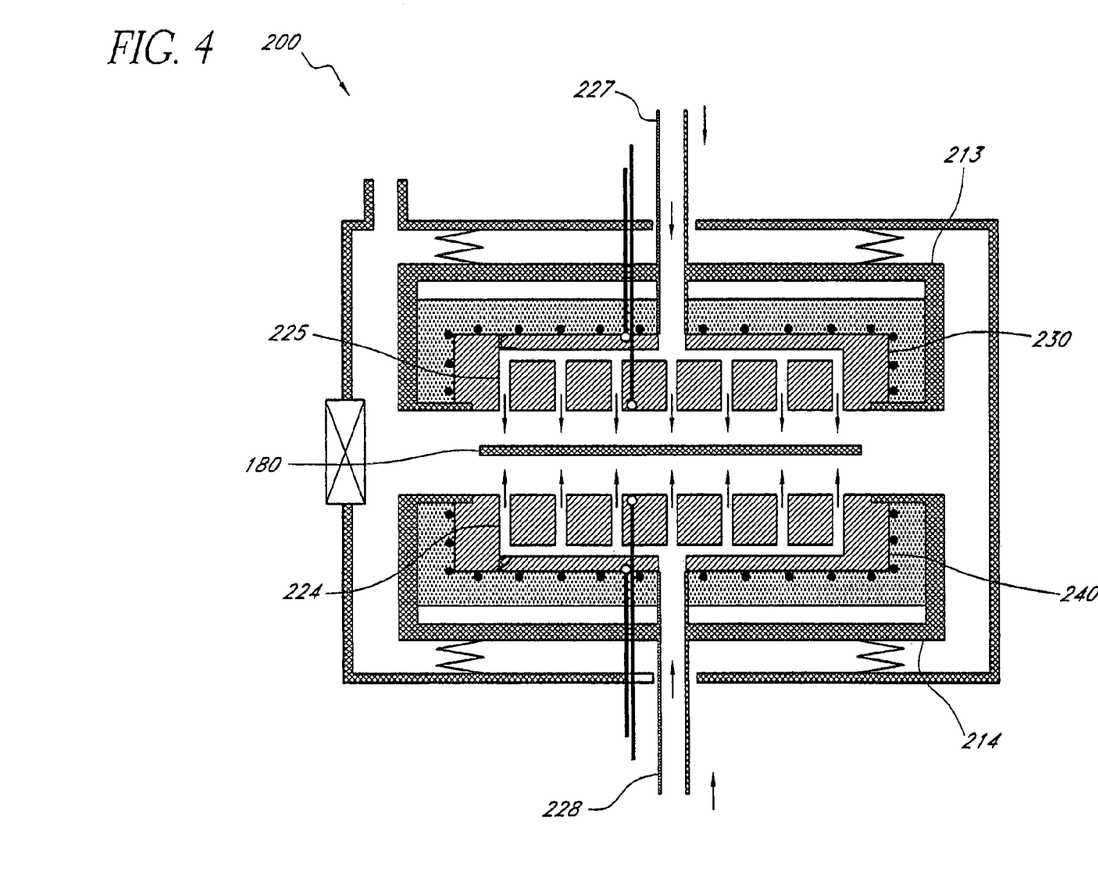
FIG. 4 is shows a schematic cross-section of an exemplary reactor for annealing substrates, in accordance with preferred embodiments of the invention.

Most preferably, the silicidation anneal is conducted in a Levitor® system, commercially available from ASM International, N.V. of Bilthoven, The Netherlands. A reactor 200 of a Levitor® system is shown in FIG. 4. In this design, the substrate 180 is loaded into a reaction space between two massive blocks or plates 213 and 214, and the reactor 200 is closed by bringing the massive blocks together until the substrate 180 is closely spaced from the blocks 213 and 214 on both sides. Advantageously, the blocks 213 and 214 include numerous gas passages 224 and 225 distributed across the substrate 180, with inert gas feeds 227 and 228 configured to provide gas cushions on either side of it, thus ensuring contactless annealing. It will be understood that, in other arrangements, the substrate 180 can be spaced from the lower wall 248 by posts or other spacers (not illustrated).

The blocks 213 and 214 are provided with heated bodies 230 and 240 that are massive. As noted above, the heated bodies 230 and 240 preferably have a thermal mass greater than about five times (5×) the thermal mass of the substrate 180, and more preferably greater than about ten times (10×) the thermal mass of the substrate 180 and are preferably a metal block that is greater than about 10 mm in thickness and, more preferably, greater than about 40 mm in thickness, measured perpendicular to the face of the substrate 180. Close spacing, less than about 2 mm and more preferably less than about 1 mm, between the substrate 180 and the blocks 213 and/or 214, provides uniform, predominantly conductive heating which is particularly advantageous in the Levitor® design. A reactor according to the Levitor® design is described in U.S. Pat. No. 6,183,565, the entire disclosure of which is incorporated herein by reference.

Figure 6A:
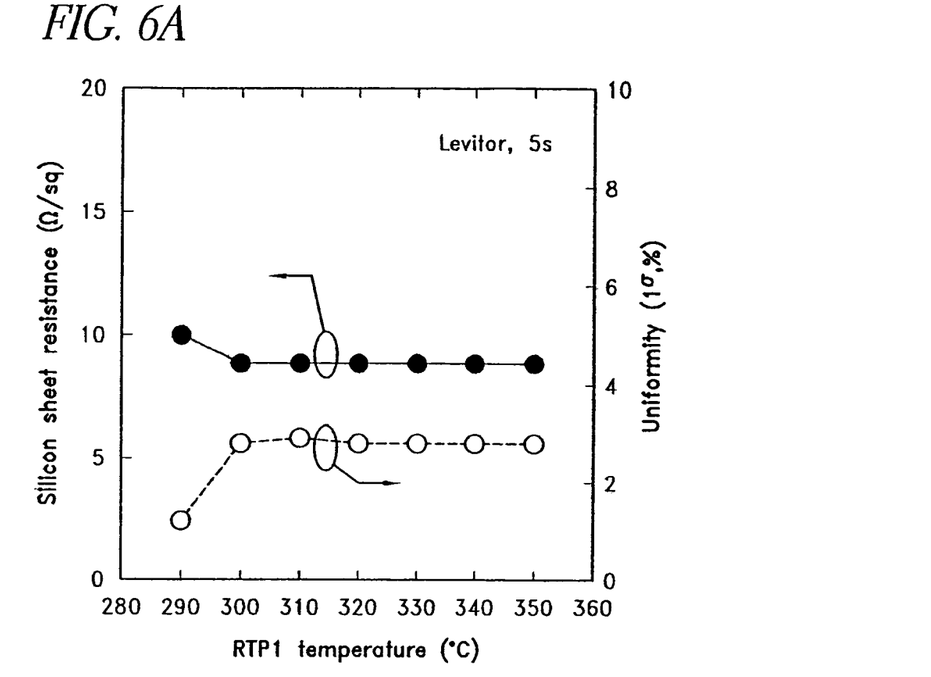
FIGS. 6a and 6b are graphs illustrating $NiSi_x$ silicide sheet resistivity and uniformity versus anneal temperatures, for blanket Ni films deposited on Si wafers, for anneal times of 5 s (FIG. 6a) and 30 s (FIG. 6b), in accordance with preferred embodiments of the invention.
Figure 6B:
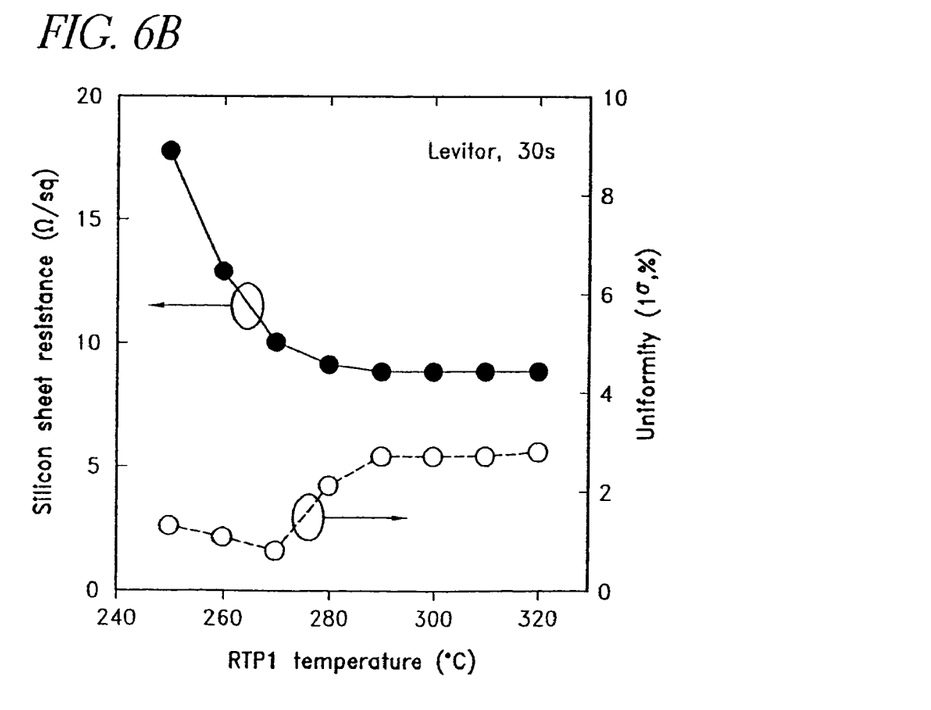
Figure 7:
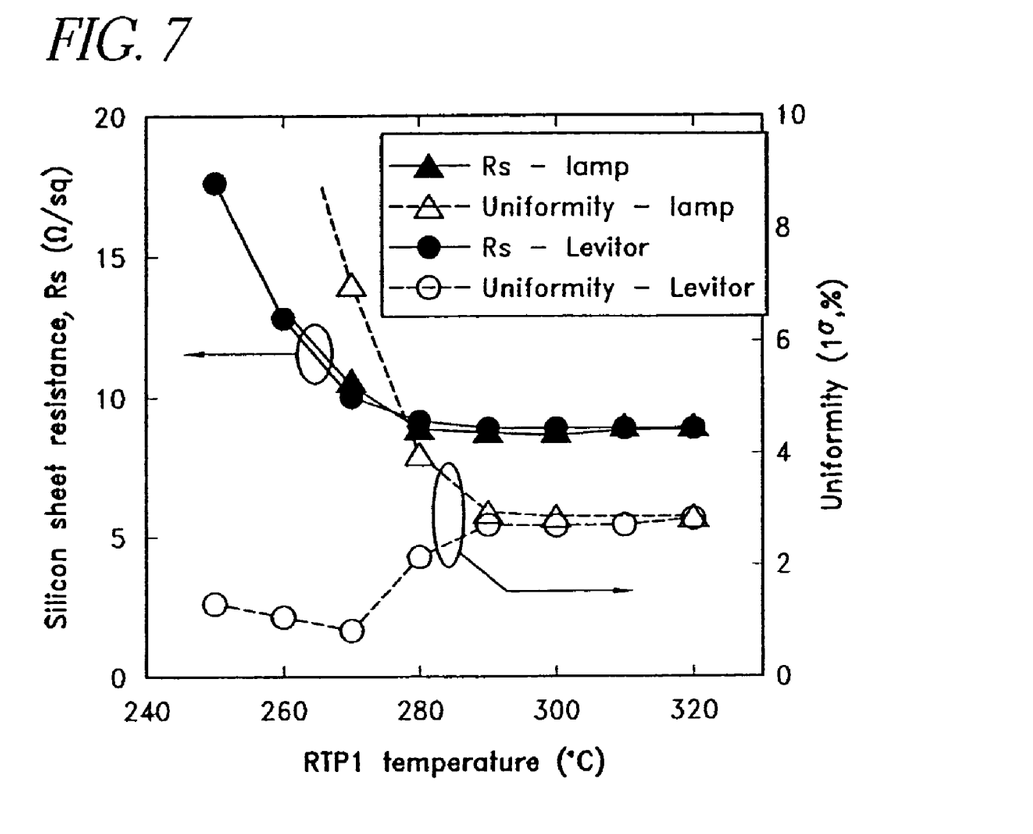
FIG. 7 is a graph of $NiSi_x$ silicide sheet resistivity and uniformity versus anneal temperatures, for blanket Ni films deposited on Si wafers, showing a comparison between 30s anneals in a closely-spaced hot plate system in accordance with preferred embodiments of the invention and in a traditional lamp-based system.

The experimental results shown in FIGS. 6 and 7 were obtained from experiments conducted in a reactor employing heated blocks on both sides of the substrate. As described in more detail below, however, the Levitor® system can also be employed for both heating and in situ cooling. Thus, in some arrangments, both the upper block or plate and the lower block or plate (preferably extending across and closely spaced from the wafer) are hot and can be kept at the same temperature, whereas in other arrangements only one of the blocks is "hot" (i.e., at or higher than the reaction temperature) while the other is "cold" (i.e., below the reaction temperature). The latter arrangement can be employed to precisely control the duration of the anneal by quickly lowering the substrate below the anneal temperature. Advantageously, such rapidly cooling can quickly stop silicidation reactions by lowering the substrate temperature below the temperatures for such reactions.

An exemplary process flow for a silicidation process and the result of the process flow is schematically represented in FIG. 5. As shown in FIG. 5a, a blanket metal layer 165, preferably nickel (Ni), is preferably deposited over the silicon substrate 180, which is preferably a silicon wafer. It will be appreciated that the wafer preferably has a patterned structure with exposed areas 190 of silicon amid insulating regions 150 (spacers in the illustrated embodiment), which can be the silicon of a previously deposited silicon layer or the silicon forming the wafer itself. Deposition of the metal layer 165 brings the metal into contact with the exposed silicon 190. It will be appreciated that, in the illustrated embodiment, the exposed silicon 190 includes silicon forming a gate electrode 110, or silicon forming source and drain regions beside the spacers 150 and opposite of the spacers 150 from the gate electrode 110.

It will also be appreciated that the metal layer deposition can be performed in the same reaction chamber as a subsequent anneal or the anneal can be performed in an anneal station different from the reaction chamber for the deposition. If an anneal station is different from the deposition chamber, the wafer can be loaded into the anneal station after the metal layer deposition. Such an anneal station can be, e.g., the reactor of a Levitor® system.

Figure 5A:
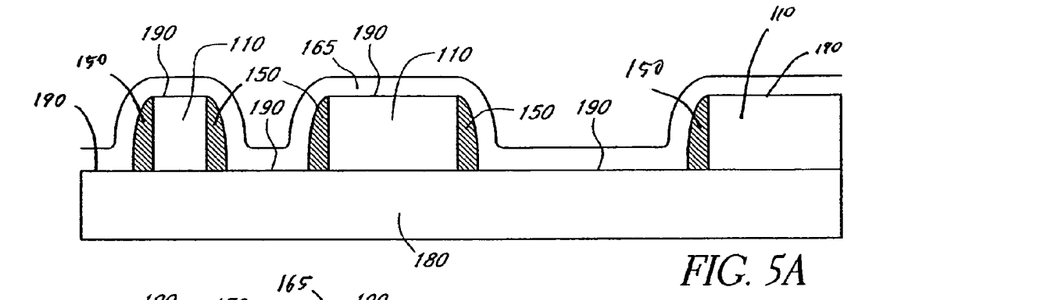
FIGS. 5a-5d are schematic cross-sections of a partially fabricated integrated circuit, illustrating a process flow in which the reverse line width effect has been suppressed, in accordance with preferred embodiments of the invention.
Figure 5B:
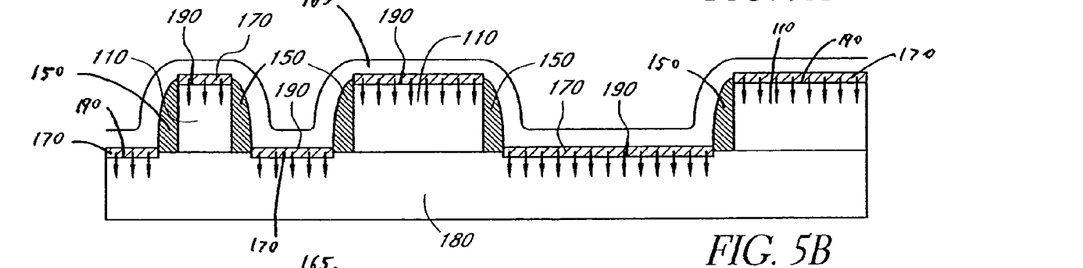
Figure 5C:
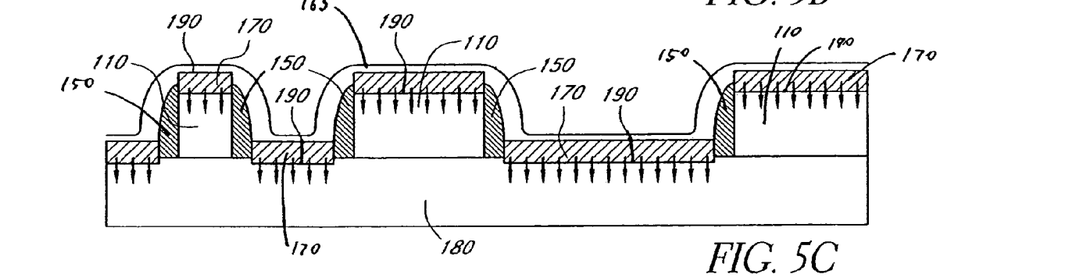

As shown in FIG. 5b, the wafer is then annealed at a silicidation temperature, i.e., the temperature at which conversion of the metal layer 165 to a silicide 170 occurs. In the illustrated example, the silicidation temperature is the temperature at which conversion of the Ni layer 165 into $NiSi_x$ 170 takes place. Preferably, the anneal is a rapid thermal anneal, in which heating is conducted for less than about 2 minutes, more preferably less than about 1 minute. This process is preferably stopped before the full Ni layer 165 is converted into $NiSi_x$ 170 as shown in FIG. 5c. At this point in the silicidation, most of the nickel feeding the NiSi formation process still comes from the remaining Ni layer 165 immediately above the exposed silicon regions 190 where the $NiSi_x$ film 170 has been forming. Although, in principle, the diffusion of Ni from other areas is always present to some extent, such diffusion contributes much less Ni to the silicidation reaction than the diffusion of the Ni immediately above the $NiSi_x$ film 170. As a result, the "reverse line width effect" can be reduced or substantially prevented. In addition, the silicide film formed by the anneal advantageously has better adhesion to the underlying silicon substrate 180 and has a more diffuse boundary than a similar film formed by, e.g., deposition processes. It will be appreciated that the silicide films 170 preferably contact source and drains regions underneath those layers.

Figure 5D:
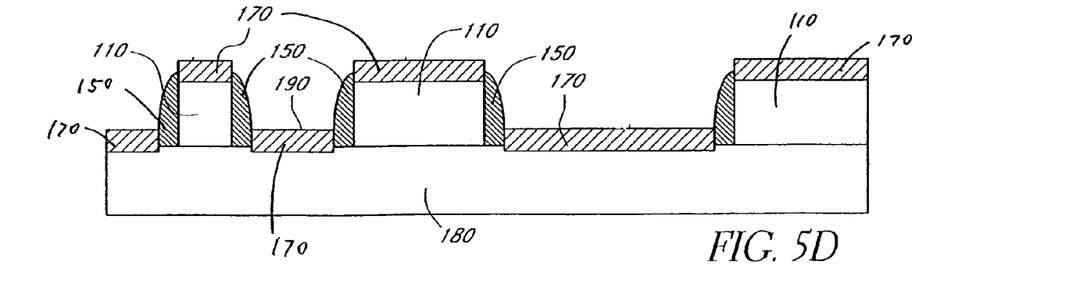

As shown in FIG. 5d, unreacted Ni can be selectively etched from the substrate by a selective metal etch, leaving $NiSi_x$ film 170. The removal of unreacted Ni 165 can be used to electrically isolate structures containing the $NiSi_x$ films 170 from each other. Thus, a low-resistivity silicide 170 on top of gate, source, drain and/or any other exposed silicon surfaces can be formed.

The uniformity of the films 170 formed by the silicidation process described above was investigated as a function of temperature and for different silicidation times. The results of these investigations are represented in FIG. 6 for blanket Ni films. Annealing times of 5 s and 30 s were applied at temperatures in the range from 250° C. to 350° C. From the results shown in FIG. 6, it is clear that full conversion of the initial PVD Ni layer takes place in temperature ranges greater than about 300° C. and greater than about 290° C., in case of 5 s and 30 s annealing times, respectively. When full conversion takes place, the uniformity in the sheet resistivity of the final $NiSi_x$ film, ~3%, is determined by the uniformity in thickness of the initial PVD Ni layer. When the temperature is sufficiently low such that only incomplete conversion takes place within the given anneal time, however, the uniformity of the resulting NiSi layer (after selectively etching the unreacted Ni) is governed by the uniformity of the thermal budget, as induced by the annealing system. In the case of annealing with the Levitor® system, this results in an improvement to about 1% to 1.5% uniformity. Consequently, in case of incomplete conversion of the Ni film, not only is the "reverse line width effect" eliminated, but also a better resistivity uniformity for a blanket film is obtained.

In FIG. 7 a comparison is shown between 30 s anneals in the Levitor® and a lamp-based annealing system. For temperatures greater than about 290° C., the sheet resistance is substantially constant (and the same) for both cases. This corresponds with the sheet resistance that is obtained when a layer of Ni is fully converted to a nickel silicide. The uniformity is also the same in that temperature range. As mentioned before, the uniformity of the sheet resistance is determined by the uniformity of the initial PVD Ni layer (~3%).

For temperatures less than about 290° C. (in the regime of incomplete silicidation), the two systems exhibit strikingly different behaviors. Whereas in the Levitor® the non-uniformity for both thickness and sheet resistance improves to about 1% to 1.5%, the non-uniformity deteriorates to >7% in the lamp-annealed films. This result is directly related to the poor heating uniformity of lamp-based systems in the temperature range of interest.

Cool-down of the wafer after annealing can be effectuated in various ways. For example, the wafer can be removed from the annealing station and cooled by free radiation and conduction to the surrounding wafer handling chamber or to the inside of a cool-down chamber. Although such cool-down is not very uniform, the uniformity of cool-down is typically not very critical. Since, during cool-down from the silicidation temperature, the first part of the cool-down curve is passed very quickly, the diffusion of additional nickel quickly decreases, such that additional diffusion of nickel becomes essentially insignificant.

In other embodiments, the wafer can be transferred from the anneal station to a cool-down station, wherein forced cooling can be used to cool the wafer. Forced cooling can be effectuated by blowing a gas stream over the wafer or by bringing the wafer in close proximity to a cooling body. Preferably, such a cool-down is performed in a cool-down station according to the Levitor® design, as disclosed in U.S. Pat. No. 6,560,896, the entire disclosure of which is incorporated herein by reference.

In another embodiment, the anneal can be performed in a Levitor® system in which the two reactor blocks are maintained at different temperatures and where the temperature of the wafer can be switched by switching of the gas flows from the blocks. Switching gas flows to affect temperature can be accomplished by switching the relative gas thermal conductivity on the two sides of a wafer, as disclosed in detail in PCT patent publication No. WO 01/50502, or by increasing flow on one side versus the other, thereby physically moving the wafer between closer to the hot block (during annealing) or closer to the cold block (during cool-down), as disclosed in U.S. Pat. No. 6,183,565. The disclosures of both WO 01/50502 and U.S. Pat. No. 6,183,565 are incorporated herein by reference in their entireties. Advantageously, because cooling is performed within the anneal station, there is no lag in the time between annealing and cooling, as would occur if the substrate were required to be unloaded and moved into a cooling station. Thus, the anneal time can be more precisely controlled, thereby allowing more precise control of the moment when the process is stopped prior to complete silicidation.

Although in the present examples reference is made to nickel and nickel silicide, it will be apparent to the skilled artisan that the present invention is applicable to silicidation processes for any metal that is able to react with silicon to form a silicide. Examples of such metals include Ti, Zr, Hf, V, Nb, Ta, Cr, Mo, W, Co, Rh, Ir, Ni, Pd and Pt.

In addition, while particularly useful in forming electrical devices with critical dimensions (CDs) of 100 nm or less, and preferably CDs of 65 nm or less, it will be appreciated that the teachings herein have applicability to forming devices of any dimension.

Furthermore, though described in the context of silicidation over patterned transistors, it will be apparent to the skilled artisan that controlled silicon consumption will be beneficial for self-aligned silicidation at any of a number of integrated circuit fabrication steps. It will be appreciated that self-aligned silicidation can also be conducted with blanket silicon over patterned metal or patterned silicon over blanket metal. The methods described herein have been found to have particular utility where excess metal is available, such that interruption of the silicidation anneal is desirable. It will be appreciated, however, that these methods are not limited to silicon or metal reactions and that the interruption of solid state reactions will have utility in a number of contexts where excess of one solid reactant is available, relative to other solid reactant(s).

Similarly, various other modifications, omissions and additions may be made to the methods and structures described above without departing from the scope of the invention. All such modifications and changes are intended to fall within the scope of the invention, as defined by the appended claims.

We claim:

1. A method for semiconductor fabrication, comprising:
   providing a semiconductor substrate parallel to and facing a first substantially flat and uniformly heated body in a process chamber, wherein the first heated body extends over an entirety of a major planar substrate surface, wherein the substrate comprises a metal film which, over at least some areas of the substrate, is in contact with a solid state reactant for forming a metallic compound upon reaction with the solid state reactant;
   uniformly heating the substrate to a reaction temperature and maintaining the substrate at the reaction temperature for a duration sufficient for part of the metal film to react with the solid state reactant to form the metallic compound; and
   removing the substrate from the annealing station before all the metal overlying the at least some areas of the substrate has reacted with the solid state reactant.

2. The method of claim 1, wherein providing the semiconductor substrate comprises positioning the substrate less than about 2 mm from the first heated body.

3. The method of claim 2, wherein providing the semiconductor substrate comprises positioning the substrate less than about 1 mm from the first heated body.

4. The method of claim 2, further comprising providing a second substantially flat and uniformly heated body disposed parallel to and facing the first heated body, wherein uniformly heating the substrate comprises disposing the substrate parallel to and facing the first and second heated bodies, wherein the first and second heated bodies each extend over the entirety of opposite planar surfaces of the substrate during uniformly heating.

5. The method of claim 1, further comprising selectively removing metal unreacted with the solid state reactant.

6. The method of claim 1, wherein the solid state reactant is solid state silicon and the metallic compound is a silicide.

7. A method for self-aligned reaction of solid state reactants over a substrate, the substrate having a planar surface, the method comprising:
   providing a blanket layer of a first solid state reactant over the substrate;
   providing a patterned structure formed of a second solid state reactant in contact with the first solid state reactant; and
   rapid thermal annealing the blanket layer and the patterned structure by disposing the substrate parallel to and facing a uniformly heated and substantially flat heated body, the heated body extending over the entirety of the planar substrate surface to form a reaction product of the first and second solid state reactants in a pattern; and
   subsequently stopping a reaction between the first and the second solid state reactants, wherein, in the areas of contact between the first and second solid sate reactants, a portion of the blanket layer remains unreacted with the second solid state reactant after stopping the reaction and a portion of the second solid state reactant remains unreacted with the blanket layer after stopping the reaction.

8. The method of claim 7, wherein rapid thermal annealing comprises conductively exchanging heat with the heated body positioned within about 2 mm of a surface of the substrate, the heated body having a thermal mass at least about 5 times a thermal mass of the substrate.

9. The method of claim 8, wherein rapid thermal annealing comprises maintaining a gas cushion between the substrate and the heated body.

10. The method of claim 9, wherein rapid thermal annealing comprises maintaining a second gas cushion between the substrate and an other substantially flat body on an opposite side of the substrate from the heated body, the substrate floating between the heat body and the other substantially flat body during rapid thermal annealing.

11. The method of claim 1, wherein stopping the reaction comprises forced cooling of the substrate after rapid thermal annealing.

12. The method of claim 7, wherein the patterned structure comprises silicon regions exposed amid insulating regions and the blanket layer comprises a metal layer overlying the silicon regions and the insulating regions.

13. The method of claim 12, wherein the silicon regions comprise transistor active areas of a semiconductor substrate and polysilicon gate structure.

14. The method of claim 13, wherein the silicon regions further comprise transistor gate spacers.

15. A method for semiconductor processing, comprising:
   providing a semiconductor wafer in a process chamber, the wafer provided with a metal film in contact with a solid state reactant over at least some areas of the wafer;
   uniformly heating the wafer to a conversion temperature and maintaining the wafer at the conversion temperature for a duration sufficient to convert at least part of the metal film over the at least some areas of the wafer into a metallic compound, the metallic compound comprising the solid state reactant and metal from the metal film; and
   stopping the conversion of the metal film into the metallic compound before all of the metal in the metal film over the at least some areas of the wafer is converted into the metallic compound, wherein stopping the conversion comprises forced cooling of the wafer.

16. The method of claim 15, wherein forced cooling of the wafer comprises:
   providing a substantially flat cooling body; and
   bringing the wafer in close proximity and parallel to the cooling body, wherein the cooling body extends over an entire wafer surface during forced cooling.

17. The method of claim 16, wherein the wafer is brought within about 2 mm of the cooling body to conductively exchange heat with the cooling body.

18. The method of claim 17, wherein the cooling body has a thermal mass at least about 5 times a thermal mass of the substrate.

19. The method of claim 16, wherein providing the semiconductor wafer comprises positioning the semiconductor wafer between a substantially flat heated body and the cooling body, wherein forced cooling of the wafer comprises switching gas flows on either side of the wafer to bring the wafer away from a temperature of the heated body and closer to a temperature of the cooling body.

20. The method of claim 19, wherein switching gas flows comprises flowing a more thermally conductive gas between the cooling body and the wafer and a less thermally conductive gas between the heated body and the wafer.

21. The method of claim 15, wherein forced cooling comprises transferring the substrate from a rapid thermal annealing station to a cooling station.

22. The method of claim 15, wherein the solid state reactant is silicon forming a part of the wafer.

* * * * *

UNITED STATES PATENT AND TRADEMARK OFFICE
CERTIFICATE OF CORRECTION

| | |
|---|---|
| PATENT NO. | : 7,691,750 B2 |
| APPLICATION NO. | : 11/595441 |
| DATED | : April 6, 2010 |
| INVENTOR(S) | : Granneman et al. |

Page 1 of 1

It is certified that error appears in the above-identified patent and that said Letters Patent is hereby corrected as shown below:

Title Page, Item (75) Inventors: please change "Ernest" to --Ernst--.

Title Page, on Page 2, Item (56) under "Other Publications," please change "$Si_{1-x-y}yGe_xC_y/Si$" to --$Si_{1-x-y}Ge_xC_y/Si$--.

Title Page, Item (56) on Page 2, Col. 2, line 69, under "Other Publications," please change "HCI" to --HCl--.

In Col. 3, line 63, please change "$NiSi_x$" to --$NiSi_x$,--.

In Col. 4, line 40, please change "stop.the" to --stop the--.

In Col. 5, line 4, please change "silicidation. process" to --silicidation process--.

In Col. 6, line 3, please change "arrangments" to --arrangements--.

In Col. 6, line 54, please change "silidication" to --silicidation--.

Signed and Sealed this

Fifth Day of October, 2010

David J. Kappos
*Director of the United States Patent and Trademark Office*